(12) United States Patent
Byeon et al.

(10) Patent No.: US 9,324,380 B2
(45) Date of Patent: Apr. 26, 2016

(54) STACKED SEMICONDUCTOR APPARATUS AND SEMICONDUCTOR SYSTEM CAPABLE OF INPUTTING SIGNALS THROUGH VARIOUS PATHS

(71) Applicant: SK hynix Inc., Icheon-si Gyeonggi-do (KR)

(72) Inventors: Sang Jin Byeon, Icheon-si (KR); Jae Bum Ko, Icheon-si (KR); Young Jun Ku, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 20 days.

(21) Appl. No.: 14/329,213

(22) Filed: Jul. 11, 2014

(65) Prior Publication Data
US 2015/0255131 A1    Sep. 10, 2015

(30) Foreign Application Priority Data

Mar. 10, 2014 (KR) .................. 10-2014-0027735

(51) Int. Cl.
*G11C 5/04* (2006.01)
*G11C 29/12* (2006.01)
*G11C 29/26* (2006.01)
(Continued)

(52) U.S. Cl.
CPC .............. *G11C 5/04* (2013.01); *G11C 29/1201* (2013.01); *G11C 29/26* (2013.01); *G11C 7/1045* (2013.01); *G11C 29/18* (2013.01); *G11C 2029/1206* (2013.01); *H01L 24/13* (2013.01); *H01L 24/16* (2013.01); *H01L 24/17* (2013.01); *H01L 25/0655* (2013.01); *H01L 25/0657* (2013.01); *H01L 25/18* (2013.01); *H01L 2224/13025* (2013.01); *H01L 2224/16146* (2013.01); *H01L 2224/16225* (2013.01); *H01L 2224/17181* (2013.01); *H01L 2225/06513* (2013.01); *H01L 2225/06517* (2013.01); *H01L 2225/06541* (2013.01); *H01L 2225/06596* (2013.01); *H01L 2924/1431* (2013.01); *H01L 2924/1433* (2013.01); *H01L 2924/1434* (2013.01); *H01L 2924/1436* (2013.01); *H01L 2924/1441* (2013.01); *H01L 2924/1443* (2013.01); *H01L 2924/157* (2013.01); *H01L 2924/15192* (2013.01)

(58) Field of Classification Search
CPC ............ G11C 8/00; G11C 29/54; G11C 8/18; G11C 29/1201; G11C 29/26; H01L 25/18; H01L 24/17
USPC .......................................... 365/63
See application file for complete search history.

(56) References Cited

U.S. PATENT DOCUMENTS

| | | | | |
|---|---|---|---|---|
| 7,698,470 B2 * | 4/2010 | Ruckerbauer | ............ | G11C 5/02 326/38 |
| 8,737,106 B2 * | 5/2014 | Best | ........................ | G11C 5/02 365/233.1 |

(Continued)

FOREIGN PATENT DOCUMENTS

| KR | 1020000011216 A | 2/2000 |
|---|---|---|
| KR | 1020090022209 A | 3/2009 |

*Primary Examiner* — Pho M Luu
*Assistant Examiner* — Xiaochun L Chen
(74) *Attorney, Agent, or Firm* — William Park & Associates Ltd.

(57) ABSTRACT

A semiconductor apparatus includes a control signal reception portion. The control signal reception portion may set information related to operation of a memory chip by receiving a command signal and an address signal from one among a stack chip test portion, a control signal interface portion and a test setting portion.

19 Claims, 5 Drawing Sheets

(51) Int. Cl.
  *H01L 25/18*  (2006.01)
  *H01L 23/00*  (2006.01)
  *H01L 25/065* (2006.01)
  *G11C 29/18*  (2006.01)
  *G11C 7/10*   (2006.01)

(56) References Cited

U.S. PATENT DOCUMENTS

| | | | | |
|---|---|---|---|---|
| 8,743,582 B2 * | 6/2014 | Kang | ................ | H01L 24/17 |
| | | | | 365/185.05 |
| 8,773,939 B2 * | 7/2014 | Oh | ................ | G11C 5/04 |
| | | | | 365/189.02 |
| 8,817,573 B2 * | 8/2014 | Ku | ................ | G11C 7/1063 |
| | | | | 365/189.05 |
| 9,082,463 B2 * | 7/2015 | Best | ................ | G11C 5/02 |
| 2009/0039915 A1 * | 2/2009 | Ruckerbauer | ................ | G11C 5/02 |
| | | | | 326/38 |
| 2011/0292708 A1 * | 12/2011 | Kang | ................ | H01L 24/17 |
| | | | | 365/63 |
| 2012/0163098 A1 * | 6/2012 | Ku | ................ | G11C 7/1063 |
| | | | | 365/189.05 |
| 2012/0294058 A1 * | 11/2012 | Best | ................ | G11C 5/02 |
| | | | | 365/51 |
| 2012/0294059 A1 * | 11/2012 | Oh | ................ | G11C 5/04 |
| | | | | 365/63 |
| 2014/0016404 A1 * | 1/2014 | Kim | ................ | G11C 11/165 |
| | | | | 365/158 |
| 2014/0233292 A1 * | 8/2014 | Kang | ................ | H01L 24/17 |
| | | | | 365/63 |
| 2014/0247637 A1 * | 9/2014 | Best | ................ | G11C 5/02 |
| | | | | 365/51 |

* cited by examiner

STACKED SEMICONDUCTOR APPARATUS AND SEMICONDUCTOR SYSTEM CAPABLE OF INPUTTING SIGNALS THROUGH VARIOUS PATHS

CROSS-REFERENCES TO RELATED APPLICATION

The present application claims priority under 35 U.S.C. §119(a) to Korean application number 10-2014-0027735, filed on Mar. 10, 2014 in the Korean Intellectual Property Office, which is incorporated herein by reference in its entirety as set forth in full.

BACKGROUND

1. Technical Field

Various embodiments generally relate to a semiconductor apparatus, and more particularly, to a semiconductor apparatus having a plurality of stacked chips and a semiconductor system having the semiconductor apparatus.

2. Related Art

In order to increase the utilization of a given space within a semiconductor apparatus, a 3 dimensional (3D) semiconductor apparatus, in which a plurality of chips are stacked and packaged in single package, has been proposed. The 3D semiconductor apparatus achieves maximum integration within a given space by vertically stacking two or more chips.

A 3D semiconductor apparatus may have a stacked plurality of chips that are the same type of chip. These chips may also be coupled to each other through wires, metal lines, or edge-wiring. The plurality of chips may also be coupled to each other by employing "Through Silicon Via" (TSV). TSV's may be used to electrically couple all of the stacked chips by vertically penetrating the plurality of stacked chips with "Via". In this way, the plurality of chips may operate as a single semiconductor apparatus. The package size of a semiconductor apparatus may depend on or may be effected by the type of coupling method used to couple the chips (i.e., wires, metal lines, edge-wiring, or TSV).

SUMMARY

In an embodiment, a semiconductor apparatus may include a control signal reception portion suitable for setting information related to operation of a memory chip by receiving a command signal and an address signal from one among a stack chip test portion, a control signal interface portion and a test setting portion in response to an input path selection signal.

In an embodiment, a semiconductor apparatus may include: a logic chip; and a memory chip stacked with the logic chip, wherein the logic chip includes: a control signal interface portion suitable for receiving a command signal and an address signal from either one of a logic chip test portion or a controller chip. The semiconductor apparatus may also include a test setting portion coupled to the control signal interface portion, and suitable for receiving the command signal and the address signal from the control signal interface portion, and wherein the memory chip comprises a control signal reception portion suitable for setting information related to operation of the memory chip by receiving the command signal and the address signal from one among a stack chip test portion, the control signal interface portion and the test setting portion in response to an input path selection signal.

In an embodiment, a semiconductor apparatus may include: a logic chip; and a memory chip stacked with the logic chip, wherein the logic chip comprises a test setting portion suitable for storing a command signal and an address signal for setting information related to operation of the memory chip, and wherein the memory chip includes: first and second channel regions suitable for operating independently from each other. The semiconductor apparatus may also include a channel selection portion suitable for coupling the test setting portion to either one of the first or second channel regions in response to a channel selection signal, and wherein the first and second channel regions comprise first and second control signal reception portions suitable for setting information related to operation of the corresponding one of the first and second channel regions based on the command signal and the address signal, respectively.

DETAILED DESCRIPTION

Hereinafter, a semiconductor apparatus will be described below with reference to the accompanying drawings through various examples of embodiments.

Figure 1:
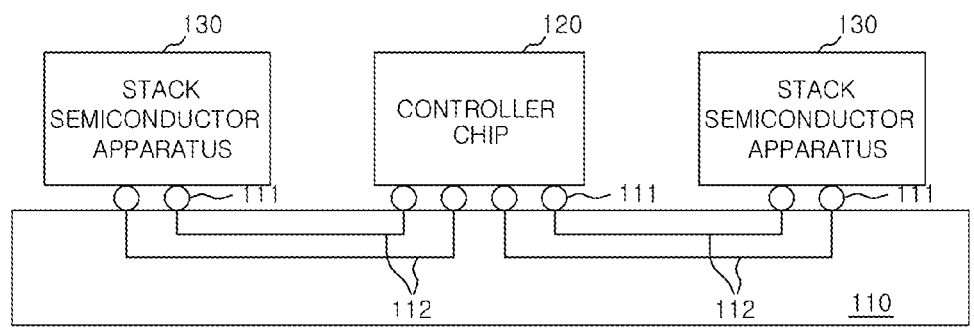
FIG. 1 is a schematic diagram illustrating a representation of an example of a semiconductor system in accordance with an embodiment.

Referring to FIG. 1, the semiconductor system 1 may include a substrate 110 and a controller chip 120. The semiconductor system 1 may also include stack semiconductor apparatuses 130. The substrate 110 may be a silicon substrate. The substrate 110 may be electrically coupled to the controller chip 120 and each stack semiconductor apparatuses 130 through bumps 111. The substrate 110 may have signal paths. These signal paths may include for example a metal layer and silicon through-via disposed thereon. The signal paths of substrate 110 may electrically couple the controller chip 120 and the stack semiconductor apparatuses 130. The substrate 110 may be an interposer for providing various signal paths for data communication of the controller chip 120 and the stack semiconductor apparatuses 130.

The controller chip 120 and the stack semiconductor apparatuses 130 may communicate through a plurality of buses 112. The plurality of buses 112 may include a data bus, a clock bus, and a data strobe bus. The plurality of buses 112 may also include a command bus, an address bus, and so forth. The controller chip 120 may provide data, a clock, a data strobe signal, a command signal, and an address signal through the plurality of buses so that the stack semiconductor apparatuses 130 may store the data. In order to receive data outputted from the stack semiconductor apparatuses 130, the controller chip 120 may provide data, a clock, a command and an address. Each of the stack semiconductor apparatuses 130 may store data or output stored data to the controller chip 120 by receiving the signals outputted from the controller chip 120 through the plurality of buses 112.

The controller chip 120 may be a memory controller or a host processor. The controller chip 120 may include a Central Processing Unit (CPU), a Graphic Processing Unit (GPU), a Digital Signal Processor (DSP), one or more process cores, a single core processor, a dual core processor, a multiple core processor, a micro-processor, a host processor, a controller, a plurality of processors or controllers, a chip, a micro-chip, a logic circuit, an integrated circuit (IC), or an application-specific IC.

The stack semiconductor apparatus 130 may be a stack memory apparatus having a plurality of stacked memory chips. The stack semiconductor apparatus 130 may include a volatile random access memory apparatus like a dynamic random access memory (DRAM). Also, the stack semiconductor apparatus 130 may include one or a combination of non-volatile random access memory apparatuses including a Phase Change Random Access Memory (PCRAM), a Resistive Random Access Memory (ReRAM), a Ferroelectric Random Access Memory (FeRAM), a Magnetic Random Access Memory (MRAM) and a Spin Transfer Torque Random Access Memory (STTRAM).

The semiconductor system 1 may be provided in a single package. The semiconductor system 1 may be implemented as a System In Package (SIP), a System On Chip, a Flip-Chip Package, and/or a Multi-Chip Package.

Figure 2:
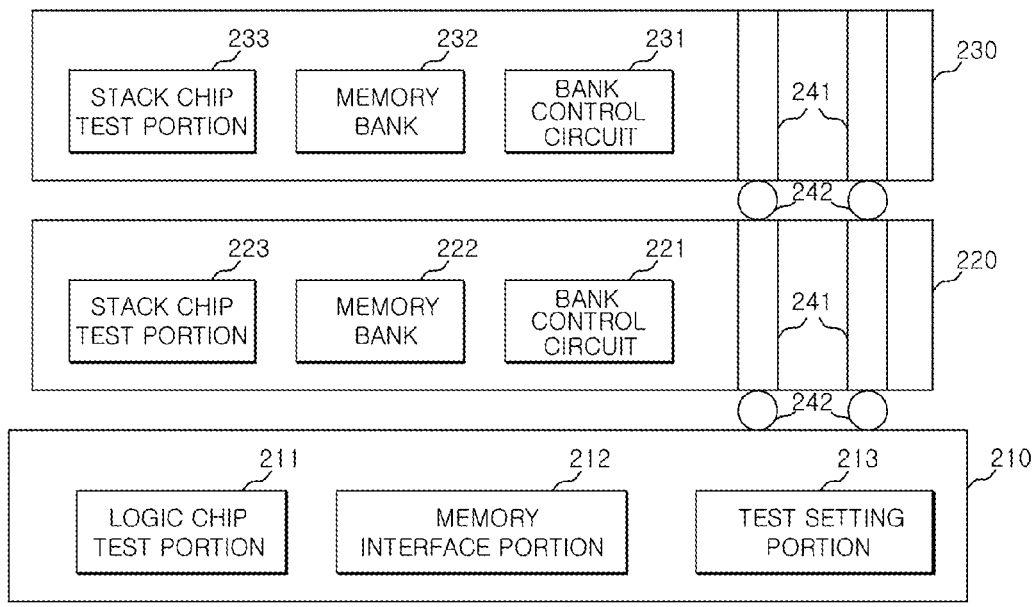
FIG. 2 is a schematic diagram illustrating a representation of an example of a stack semiconductor apparatus in accordance with an embodiment.

FIG. 2 is a schematic diagram illustrating a representation of an example of a stack semiconductor apparatus 2 in accordance with an embodiment. The stack semiconductor apparatus 2 may correspond to the stack semiconductor apparatus 130 described above with reference to FIG. 1. Referring to FIG. 2, the stack semiconductor apparatus 2 may include a logic chip 210. The stack semiconductor apparatus 2 may also include a plurality of memory chips 220 and 230. The plurality of memory chips 220 and 230 may be sequentially stacked over the logic chip 210. The logic chip 210 and each of the plurality of memory chips 220 and 230 may be electrically coupled to each other through through-vias 241 and bumps 242.

The logic chip 210 may route data communication between the controller chip 120 illustrated in FIG. 1 and the plurality of memory chips 220 and 230. The logic chip 210 may transfer data, a clock, a command signal, and an address signal, which are transmitted from the controller chip 120, to the plurality of memory chips 220 and 230. The logic chip 210 may also transfer data, which is transmitted from the plurality of memory chips 220 and 230, to the controller chip 120. The logic chip 210 may include a logic chip test portion 211 and a memory interface portion 212. The logic chip 210 may also include a test setting portion 213. The logic chip test portion 211 may be provided for the testing of both the logic chip 210 and the stack semiconductor apparatus 2. The logic chip test portion 211 may be directly accessed by an external test device (not illustrated). The logic chip test portion 211 may receive control signals from the external test device for the testing of both the logic chip 210 and the stack semiconductor apparatus 2. The logic chip test portion 211 may include a direct access pin or a pad for direct access of the external test device to the logic chip test portion 211. Also, the logic chip test portion 211 may include a plurality of logic circuits for testing the logic chip 210 and the stack semiconductor apparatus 2. The logic chip test portion 211 may include a built-in self-test circuit. The self-test may include but is not limited to a test for connectivity between a silicon through-via and a bump, a boundary scan test, a burn-in stress test, and a data compression test. The memory interface portion 212 may receive all of the control signals transmitted from the controller chip 120 for operation of the stack semiconductor apparatus 2. Also, the memory interface portion 212 may output operation results of the stack semiconductor apparatus 2 to the controller chip 120.

The test setting portion 213 may store information about test types, data patterns, a command signal, an address signal, and so forth in order to test the plurality of memory chips 220 and 230. The test setting portion 213 may operate based on the stored information so that a desired test may be performed to the plurality of memory chips 220 and 230. The test setting portion 213 may be a standard interface, for example IEEE 1500, for performing a test to the plurality of memory chips 220 and 230.

Referring to FIG. 2, each of the plurality of memory chips 220 and 230 may include a bank control circuit 221 and 231 and a memory bank 222 and 232. The plurality of memory chips 220 and 230 may also include a stack chip test portion 223 and 233. The bank control circuits 221 and 231 may receive signals required for data input and output operations, which are transmitted from the memory interface portion 212. The bank control circuits 221 and 231 may store data into the memory banks 222 and 232, or may output data, which is stored in the memory banks 222 and 232. The memory banks 222 and 232 may include a plurality of memory cells, and provide storage for storing data inputted from the memory interface portion 212.

The stack chip test portions 223 and 233 may be provided for testing each of the plurality of memory chips 220 and 230. The stack chip test portions 223 and 233 may be provided in order to test the plurality of memory chips 220 and 230 at a wafer level where the plurality of memory chips 220 and 230 are not yet stacked with a logic chip or another memory chip. The stack chip test portions 223 and 233 may be directly accessed by an external test device. The stack chip test portions 223 and 233 may receive control signals for testing the plurality of memory chips 220 and 230 from the external test device. The stack chip test portions 223 and 233 may be disabled in response to a stack enable signal when the plurality of memory chips 220 and 230 are stacked with the logic chip 210 and another memory chip through the through-vias 241. Any signal capable of informing that the plurality of memory chips 220 and 230 are stacked with another chip may be used as the stack enable signal. For example, after the plurality of memory chips 220 and 230 are stacked over the logic chip 210, the stack enable signal may be internally generated in the logic chip 210, or may be inputted from the controller chip 120.

Figure 3:
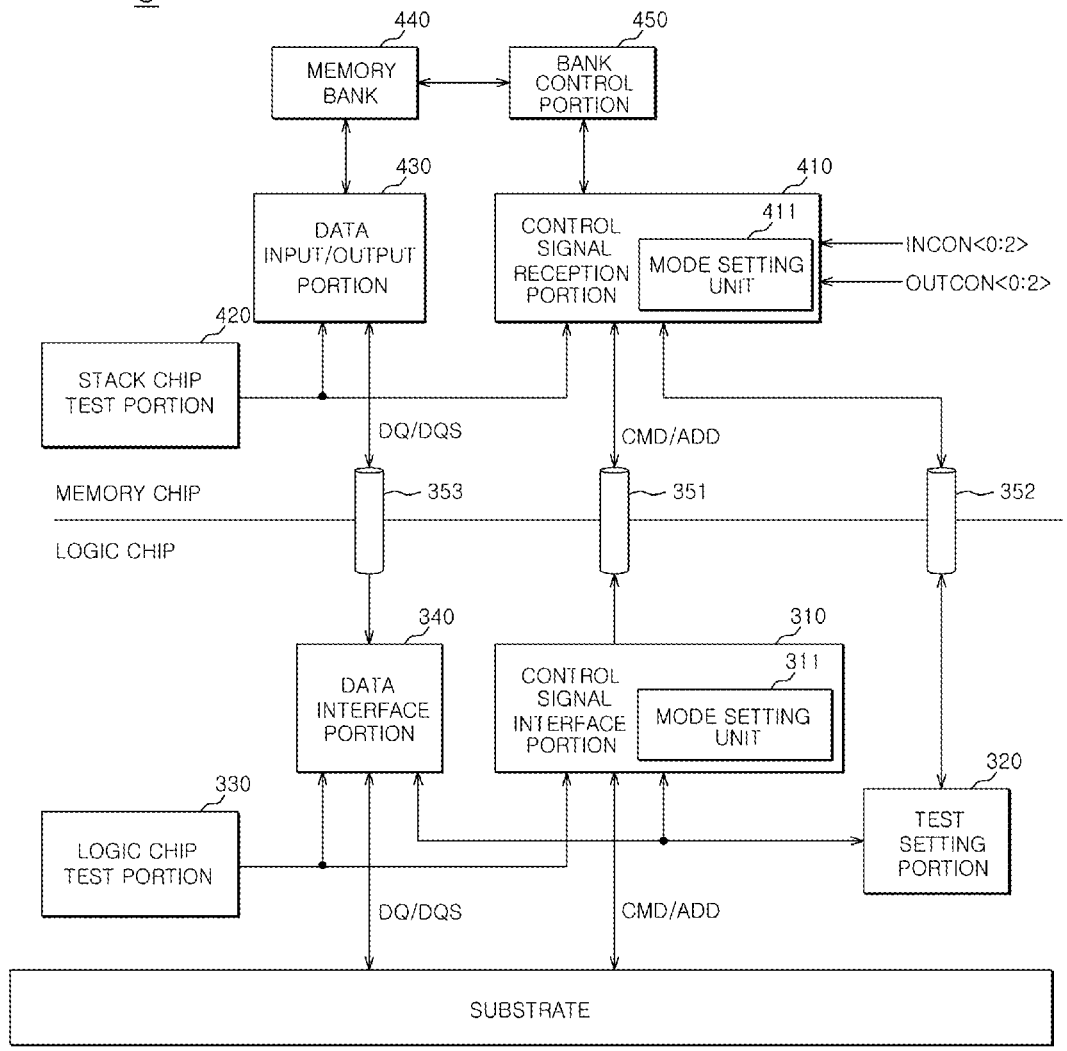
FIG. 3 is a block diagram illustrating a representation of an example of a stack semiconductor apparatus in accordance with an embodiment.

FIG. 3 is a block diagram illustrating a stack semiconductor apparatus 3 in accordance with an embodiment. Referring to FIG. 3, the stack semiconductor apparatus 3 may include a logic chip and a memory chip. Even though FIG. 3 illustrates one memory chip stacked over a logic chip, the embodiments are not limited in this manner and may include two or more memory chips stacked over a logic chip. The logic chip may be electrically coupled to the controller chip 120 through a substrate, and may receive a signal transmitted from the controller chip 120. The logic chip may also output a signal to the controller chip 120. Also, the logic chip may be electrically coupled to the memory chip through a through-via.

The logic chip may include a control signal interface portion 310 and a test setting portion 320. The logic chip may also include a logic chip test portion 330. The control signal interface portion 310 may receive a command signal CMD and an address signal ADD for data input and output operations of the memory chip. The control signal interface portion 310 may receive the command signal CMD and the address signal ADD from the test portion 330. The control signal interface portion 310 may receive the command signal CMD and the address signal ADD from the controller chip 120. The control signal interface portion 310 may be electrically coupled to the memory chip through a first through-via 351, and may transmit the command signal CMD and the address signal ADD to the memory chip through the first through-via 351. Also, the control signal interface portion 310 may set information related to operation of the logic chip based on the command signal CMD and the address signal ADD. The control signal interface portion 310 may include a mode setting unit 311. The mode setting unit 311 may be used for setting the information related to operation of the logic chip in response to the command signal CMD and the address signal ADD. The test setting portion 320 and the logic chip test portion 330 may be the same as the test setting portion 213 and the logic chip test portion 211 described above with reference to FIG. 2, respectively. The test setting portion 320 may be electrically coupled to the memory chip through a second through-via 352.

Referring to FIG. 3, the logic chip may further include a data interface portion 340. The data interface portion 340 and the control signal interface portion 310 may be, for example, included in the memory interface portion 212 described above with reference to FIG. 2. The data interface portion 340 may receive data DQ and a data strobe signal DQS from the controller chip 120. The data interface portion 340 may receive data DQ and a data strobe signal DQS from the logic chip test portion 330. The data interface portion 340 may be electrically coupled to the memory chip through a third through-via 353. The data interface portion 340 may transmit the data DQ and the data strobe signal DQS to the memory chip through the third through-via 353. Also, the data interface portion 340 may receive the data DQ and the data strobe signal DQS from the memory chip. The data interface portion 340 may also output the received data DQ and data strobe signal DQS to the logic chip test portion 330. The data interface portion 340 may also output the received data DQ and data strobe signal DQS to the controller chip 120.

The test setting portion 320 may be coupled to the control signal interface portion 310. The test setting portion 320 may also be coupled to the data interface portion 340. The control signal interface portion 310 may output a command signal CMD and an address signal ADD. The test setting portion 320 may receive and store the command signal CMD and the address signal ADD outputted from the control signal interface portion 310. The test setting portion 320 may transmit the stored command signal CMD and address signal ADD to the memory chip through the second through-via 352.

Referring to FIG. 3, the memory chip may include a control signal reception portion 410. The memory chip may also include a stack chip test portion 420. The stack chip test portion 420 may be the same as the stack chip test portion 223 and 233 described above with reference to FIG. 2. The control signal reception portion 410 may be electrically coupled to the stack chip test portion 420. The control signal reception portion 410 may be electrically coupled to the control signal interface portion 310 through the first through-via 351. The control signal reception portion 410 may be electrically coupled to the test setting portion 320 through the second through-via 352. The control signal reception portion 410 may receive the command signal CMD and the address signal ADD from the stack chip test portion 420, the control signal interface portion 310, and the test setting portion 320, and may generate control signals for operation of the memory chip. For example, the control signals may include but are not limited to a row address signal, a column address signal, a write signal, and a read signal. Also, the control signal reception portion 410 may receive the command signal CMD and the address signal ADD from one of the following: the stack chip test portion 420, the control signal interface portion 310, and the test setting portion 320 in response to a input path selection signal INCOM<0:2>, and the control signal reception portion 410 may set information related to operation of the memory chip based on the received command signal CMD and address signal ADD. For example, the information related to operation of the memory chip may include but is not limited to information related to the frequency range of a clock used in the memory chip, latency, internal voltage level, and so forth. The control signal reception portion 410 may include a mode setting unit 411. The mode setting unit 411 may set the information related to operation of the memory chip based on the command signal CMD and the address signal ADD. The mode setting unit 411 may include a mode register set or an extended mode register set for setting the information related to operation of the memory chip.

Before the memory chip is stacked with the logic chip or another memory chip, the control signal reception portion 410 may receive the command signal CMD and the address signal ADD from the stack chip test portion 420, and may set the information related to operation of the memory chip in response to the input path selection signal INCOM<0:2>. Also, after the memory chip is stacked with the logic chip, the control signal reception portion 410 may receive the command signal CMD and the address signal ADD from one of the following: the control signal interface portion 310 and the test setting portion 320, and may set the information related to operation of the memory chip in response to the input path selection signal INCOM<0:2>. The control signal reception portion 410 may receive the command signal CMD and the address signal ADD through various paths. For example, when the control signal reception portion 410 receives the command signal CMD and the address signal ADD through the control signal interface portion 310, and sets the information related to operation of the memory chip, the control signal reception portion 410 may receive the command signal CMD and the address signal ADD from the test setting portion 320 in response to the input path selection signal INCOM<0:2>. Therefore, the mode setting unit 411 may set the information related to operation of the memory chip while the memory chip is performing an operation.

The memory chip may further include a data input/output portion 430 and a memory bank 440. The memory chip may also include a bank control portion 450. The data input/output portion 430 may be electrically coupled to the data interface portion 340 through the third through-via 353, and may receive the data DQ and the data strobe signal DQS from the data interface portion 340. The memory bank 440 may provide storage for storing data. The bank control portion 450 may control the memory bank 440 to store data, which is received through the data input/output portion 430, according to a control signal, which is generated from the control signal reception portion 410. Also, the bank control portion 450 may control the data input/output portion 430 to output data, which is stored in the memory bank 440, according to a control signal, which is generated from the control signal reception portion 410. The data input/output portion 430, the bank control portion 450, and the control signal reception portion 410 may be included in the bank control circuit 221 and 231 described above with reference to FIG. 2.

Also, the control signal reception portion 410 may output the information, which is set by the mode setting unit 411, to one of the following: the stack chip test portion 420, the control signal interface portion 310, and the test setting portion 320 in response to a output path selection signal OUTCON<0:2>. Before the memory chip is stacked with the logic chip or another memory chip, the control signal reception portion 410 may output the information to the stack chip test portion 420 in response to the output path selection signal OUTCON<0:2>. After the memory chip is stacked with the logic chip, the control signal reception portion 410 may output the information to one of the following: the control signal interface portion 310 and the test setting portion 320 in response to the output path selection signal OUTCON<0:2>.

Figure 4:
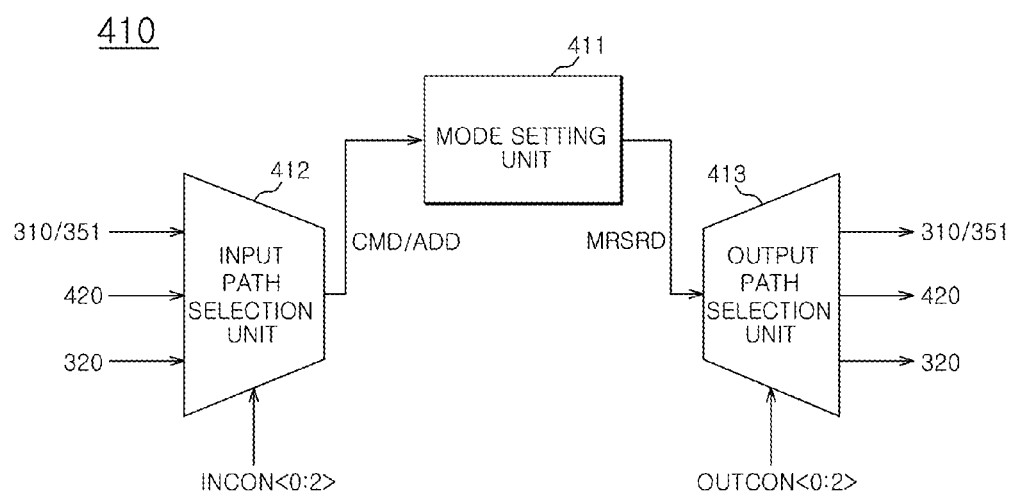
FIG. 4 is a block diagram illustrating a representation of an example of a control signal reception portion illustrated in FIG. 3.

FIG. 4 is a block diagram illustrating an example of the control signal reception portion 410 illustrated in FIG. 3. Referring to FIG. 4, the control signal reception portion 410 may include an input path selection unit 412 and the mode setting unit 411. The control signal reception portion 410 may also include an output path selection unit 413. The input path selection unit 412 may electrically couple the mode setting unit 411 and to one of the following: the stack chip test portion 420, the control signal interface portion 310, and the test setting portion 320 in response to the input path selection signal INCOM<0:2> (see FIG. 3). The input path selection unit 412 may be electrically coupled to the control signal interface portion 310 through the first through-via 351 (i.e., 310/351). The mode setting unit 411 may set the information related to operation of the memory chip based on the command signal CMD and the address signal ADD, which are received through the input path selection unit 412. Also, the mode setting unit 411 may output the set information MRSRD to the output path selection unit 413. The output path selection unit 413 may output the set information MRSRD, which is output from the mode setting unit 411, to one of the following: the stack chip test portion 420, the control signal interface portion 310, and the test setting portion 320 in response to the output path selection signal OUTCON<0:2>.

The stack semiconductor apparatus 3 (see FIG. 3) may set the information related to operation of the memory chip through various paths. When the memory chip is not stacked with the logic chip or another memory chip, the mode setting unit 411 of the control signal reception portion 410 may set the information related to operation of the memory chip in response to the command signal CMD and the address signal ADD. The command signal CMD and the address signal ADD may be inputted from the external test device through the stack chip test portion 420. The set information MRSRD may be outputted to the stack chip test portion 420. The set information MRSRD may be verified as to whether or not the set information MRSRD is correctly set by the mode setting unit 411. When the memory chip is stacked with the logic chip, the mode setting unit 411 of the control signal reception portion 410 may set the information related to operation of the memory chip in response to the command signal CMD and the address signal ADD, which are inputted from the controller chip 120 through the control signal interface portion 310, and may set the information related to operation of the memory chip in response to the command signal CMD and the address signal ADD, which are stored in the test setting portion 320. The set information MRSRD, which is set by the mode setting unit 411, may be outputted to the controller chip 120 or the test setting portion 320, and may be verified as to whether or not the set information MRSRD is correctly set by the mode setting unit 411. Since the control signal interface portion 310 may provide the command signal CMD and the address signal ADD for a test operation or a normal operation for data input and output while the test operation or the normal operation is being performed on the memory chip after the memory chip is stacked with the logic chip, the mode setting unit 411 may not receive the command signal CMD and the address signal ADD for setting the information related to operation of the memory chip from the control signal interface portion 310. At this time, the test setting portion 320 may provide the command signal CMD and the address signal ADD to the mode setting unit 411 through another path, and the information related to operation of the memory chip may be set in the middle of the test operation and the normal operation of the memory chip. Also, it may be easily verified whether or not the set information MRSRD, which is set by the mode setting unit 411, may be correctly set by outputting the set information MRSRD to the test setting portion 320.

Figure 5:
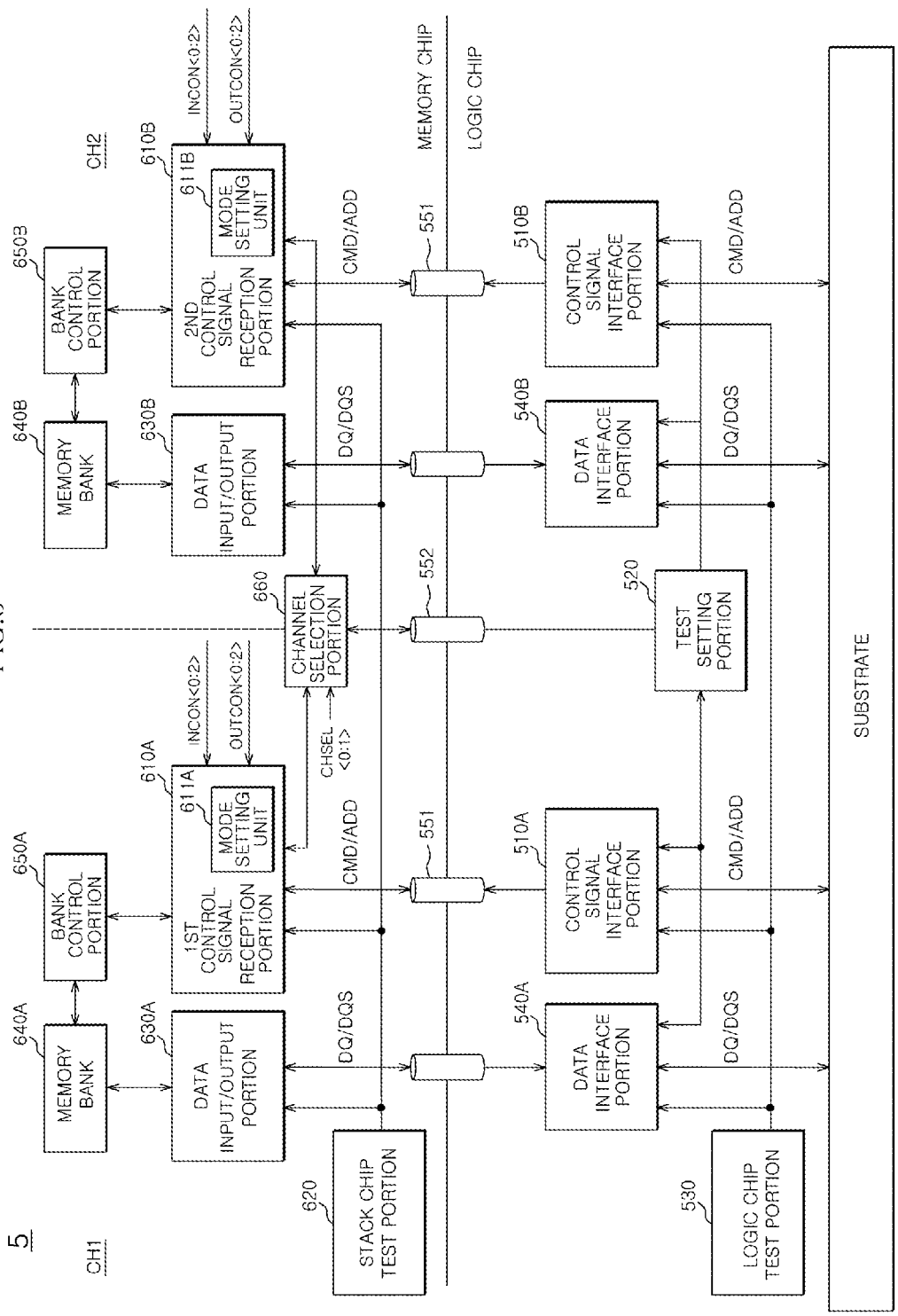
FIG. 5 is a block diagram illustrating a representation of an example of a stack semiconductor apparatus in accordance with an embodiment.

FIG. 5 is a block diagram illustrating an example of a stack semiconductor apparatus 5 in accordance with an embodiment. Referring to FIG. 5, the stack semiconductor apparatus 5 may include a logic chip and a memory chip. The logic chip and the memory chip may be stacked with each other. The memory chip may include a first channel region CH1. The memory chip may also include a second channel region CH2. Each of the first and second channel regions CH1 and CH2 may operate independently from each other. The first channel region CH1 may operate independently from the second channel region CH2. For example, each of the first and second channel regions CH1 and CH2 may receive different commands, addresses, and data, and perform different operations according to the received signals.

The logic chip may include a control signal interface portion 510A and a data interface portion 540A. The control signal interface portion 510A and the data interface portion 54A may be coupled to the first channel region CH1, a control signal interface portion 510B, and a data interface portion 540B. The control signal interface portion 510B, and a data interface portion 540B may be coupled to the second channel region CH2, a test setting portion 520, and a logic chip test portion 530. The control signal interface portion 510A and the data interface portion 54A may be coupled to the logic chip test portion 530. The elements shown in FIG. 5 may have the same structure and perform the same operation as the elements described above with reference to FIG. 3. As illustrated in FIG. 5, since the memory chip may have the first and second channel regions CH1 and CH2, the control signal interface portion 5106 and the data interface portion 540B, which are coupled to the second channel region CH2, may be added to the stack semiconductor apparatus 5.

The memory chip may include a first control signal reception portion 610A and a second control signal reception portion 610B. The memory chip may also include a stack chip test portion 620 and a channel selection portion 660. The first control signal reception portion 610A may be coupled to the stack chip test portion 620 and the control signal interface portion 510A. The first control signal reception portion 610A may also be coupled to the channel selection portion 660. The first control signal reception portion 610A may be coupled to the control signal interface portion 510A through a first through-via 551. The first control signal reception portion 610A may generate a control signal for operation of the first channel region CH1 of the memory chip based on the command signal CMD and the address signal ADD. The command signal CMD and the address signal ADD may be inputted through the stack chip test portion 620, the control signal interface portion 510A, and the channel selection portion 660. Also, the first control signal reception portion 610A may receive the command signal CMD and the address signal ADD from one of the following: the stack chip test portion 620, the control signal interface portion 510A, and the channel selection portion 660. The first control signal reception portion 610A may set information related to operation of the first channel region CH1 of the memory chip in response to the input path selection signal INCOM<0:2>. The first control signal reception portion 610A may include a mode setting unit 611A for setting the information related to operation of the first channel region CH1 of the memory chip in response to the command signal CMD and the address signal ADD.

The second control signal reception portion 610B may be coupled to the stack chip test portion 620 and the control signal interface portion 510B. The second control signal reception portion 610B may also be coupled to the channel selection portion 660. The second control signal reception portion 610B may be coupled to the control signal interface portion 510B through the first through-via 551. The second control signal reception portion 610B may generate a control signal for operation of the second channel region CH2 of the memory chip based on the command signal CMD and the address signal ADD. The command signal CMD and the address signal ADD may be inputted to the second control signal reception portion 610B through the stack chip test portion 620, the control signal interface portion 510B, and the channel selection portion 660. Also, the second control signal reception portion 610B may receive the command signal CMD and the address signal ADD from one of the following: the stack chip test portion 620, the control signal interface portion 510B, and the channel selection portion 660, and may set information related to operation of the second channel region CH2 of the memory chip in response to the input path selection signal INCOM<0:2>. The second control signal reception portion 610B may include a mode setting unit 611B for setting the information related to operation of the second channel region CH2 of the memory chip in response to the command signal CMD and the address signal ADD.

The channel selection portion 660 may be coupled to the test setting portion 520. The channel selection portion 660 may be coupled to the test setting portion 520 through a second through-via 552. The channel selection portion 660 may couple the test setting portion 520 to one of the first and second control signal reception portions 610A and 610B in response to a channel selection signal CHSEL<0:1>. Therefore, the command signal CMD and the address signal ADD, which are stored in the test setting portion 520, may be inputted to one of the first and second control signal reception portions 610A and 610B through the channel selection portion 660. The channel selection signal CHSEL<0:1> may be a signal for selecting one of the first and second channel regions CH1 and CH2 to be accessed. For example, the channel selection signal CHSEL<0:1> may be received from the controller chip 120, or may be generated by the test setting portion 520.

The stack semiconductor apparatus 5 may include the channel selection portion 660 in order to selectively couple a plurality of channel regions to the test setting portion 520. A plurality of channel regions may form the memory chip. Therefore, the test setting portion 520 may provide the command signal CMD and the address signal ADD to the selected channel region so that the information related to operation of the selected channel region may be set. Also, the test setting portion 520 may receive the set information from the selected channel region through the channel selection portion 660, and may verify whether or not the set information related to the operation of the selected channel region is correctly set. FIG. 5 illustrates a single memory chip divided into a plurality of channel regions, to which an embodiment is not limited. The stack semiconductor apparatus 5 may include two or more of memory chips, which are stacked with a logic chip, independent channels are assigned to each of memory chips and thus each of memory chips may independently operate. At this time, the channel selection portion 660 may be modified and applicable to be disposed in each of the plurality of memory chips.

The memory chip may further include a data input/output portion 630A, a memory bank 640A, and a bank control portion 650A, which are disposed in the first channel region CH1. The memory chip may further include a data input/output portion 630B, a memory bank 640B, and a bank control portion 650B, which are disposed in the second channel region CH2. The elements illustrated in FIG. 5 may have the substantially same structure and perform the substantially same operations as the element described above with reference to FIG. 3.

Figure 6:
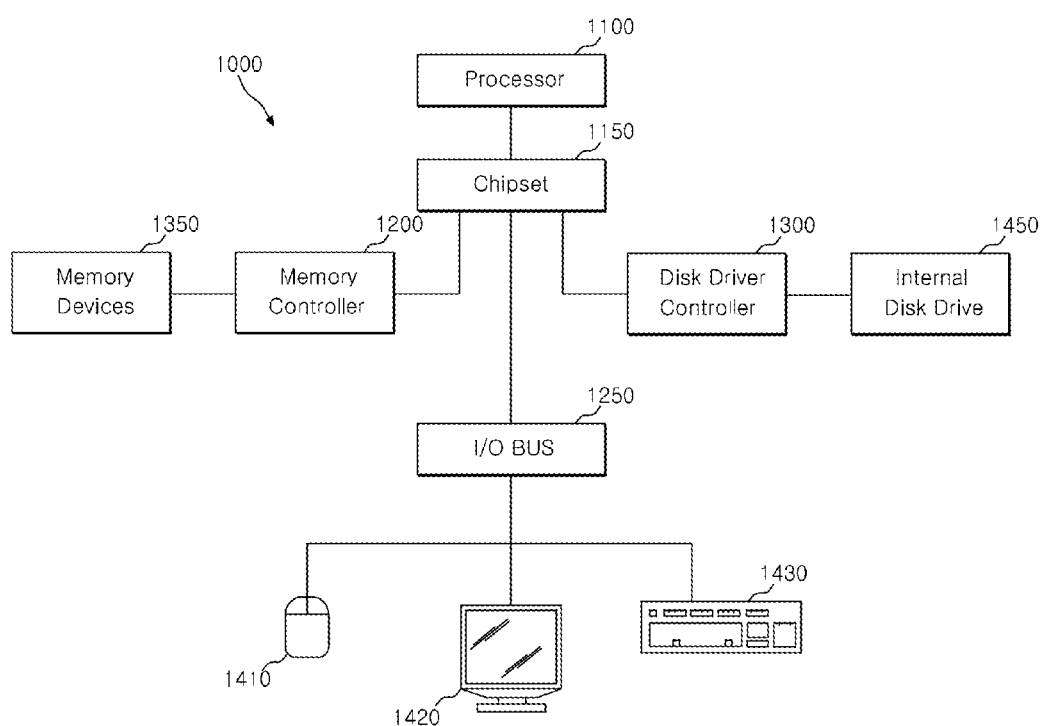
FIG. 6 illustrates a block diagram representation of an example of a system employing the semiconductor apparatus in accordance with the embodiments discussed above with relation to FIGS. 1-5.

The semiconductor apparatuses discussed above are particular useful in the design of memory devices, processors, and computer systems. For example, referring to FIG. 6, a block diagram of a system employing the semiconductor apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor apparatus as discussed above with relation to FIGS. 1-5, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor apparatus as discussed above with relation to FIGS. 1-5. In alternate embodiments, such as cellular phones or digital cameras, the components may differ from the embodiments shown in FIG. 6.

While various embodiments have been described above, it will be understood to those skilled in the art that the embodiments described are by way of example only. Accordingly, the stacked semiconductor apparatus and the semiconductor system capable of inputting signals through various paths should not be limited based on the described embodiments. Rather, the stacked semiconductor apparatus and the semiconductor system capable of inputting signals through various paths described herein should only be limited in light of the claims that follow when taken in conjunction with the above description and accompanying drawings.

What is claimed is:

1. A semiconductor apparatus comprising:
a control signal reception portion suitable for setting information related to operation of a memory chip by receiving a command signal and an address signal from one among a stack chip test portion, a control signal interface portion and a test setting portion in response to an input path selection signal,
wherein the test setting portion receives the command signal and the address signal from the control signal interface portion, and the command signal and the address signal for setting information related to operation of the memory chip are provided from the test setting portion when the command signal and the address signal for a normal operation of the memory chip are provided from the control signal interface portion.

2. The semiconductor apparatus of claim 1, wherein the stack chip test portion is configured to receive the command signal and the address signal from outside the semiconductor apparatus.

3. The semiconductor apparatus of claim 1, wherein the control signal interface portion is disposed in a logic chip and is coupled to the control signal reception portion, the logic chip being stacked with the memory chip, and the control signal interface portion is configured to transfer the command signal and the address signal, which are received from a controller chip, to the control signal reception portion.

4. The semiconductor apparatus of claim 1, wherein the test setting portion is disposed in a logic chip, the logic chip being stacked with the memory chip, and the test setting portion configured to store the command signal and the address signal, which are provided to the control signal reception portion.

5. The semiconductor apparatus of claim 1, wherein the control signal reception portion is configured to output the information set by the control signal reception portion to one among the stack chip test portion, the control signal interface portion and the test setting portion in response to a output path selection signal.

6. A semiconductor apparatus comprising:
a logic chip; and
a memory chip stacked with the logic chip,
wherein the logic chip comprises:
a control signal interface portion suitable for receiving a command signal and an address signal from either one of a logic chip test portion or a controller chip; and
a test setting portion coupled to the control signal interface portion, and suitable for receiving the command signal and the address signal from the control signal interface portion,
wherein the memory chip comprises:
a control signal reception portion suitable for setting information related to operation of the memory chip by receiving the command signal and the address signal from one among a stack chip test portion, the control signal interface portion and the test setting portion in response to an input path selection signal,
wherein the command signal and the address signal for setting information related to operation of the memory chip are provided from the test setting portion when the command signal and the address signal for a normal operation of the memory chip are provided from the control signal interface portion.

7. The semiconductor apparatus of claim 6, wherein before the memory chip is stacked with the logic chip, the information related to operation of the memory chip is set by the memory chip after receiving the command signal and the address signal from the stack chip test portion in response to the input path selection signal, and
wherein after the memory chip is stacked with the logic chip, the memory chip sets the information related to operation of the memory chip is set by the memory chip after receiving the command signal and the address signal from one of the control signal interface portion and the test setting portion in response to the input path selection signal.

8. The semiconductor apparatus of claim 6, wherein the control signal interface portion is configured to provide the command signal and the address signal to the control signal reception portion through a first through-via.

9. The semiconductor apparatus of claim 8, wherein the control signal interface portion includes a mode setting unit suitable for setting information related to operation of the logic chip in response to the command signal and the address signal.

10. The semiconductor apparatus of claim 6, wherein the test setting portion is coupled to the control signal reception portion through a second through-via.

11. The semiconductor apparatus of claim 6, wherein the control signal reception portion comprises:
a mode setting unit suitable for setting the information related to operation of the memory chip in response to the command signal and the address signal; and
an input path selection unit suitable for coupling the mode setting unit to one among the stack chip test portion, the control signal interface portion, and the test setting portion in response to the input path selection signal.

12. The semiconductor apparatus of claim 11, wherein the control signal reception portion further comprises:
an output path selection unit suitable for outputting the information set by the mode setting unit to one among the stack chip test portion, the control signal interface portion, and the test setting portion in response to an output path selection signal.

13. A semiconductor apparatus comprising:
a logic chip; and
a memory chip stacked with the logic chip,
wherein the logic chip comprises a control signal interface portion suitable for receiving a command signal and an address signal from a logic chip test portion and a controller chip; and
a test setting portion suitable for storing the command signal and the address signal for setting information related to operation of the memory chip,
wherein the test setting portion is configured to store the command signal and the address signal received from the control signal interface portion, and the command signal and the address signal for setting information related to operation of the memory chip are provided from the test setting portion when the command signal and the address signal for a normal operation of the memory chip are provided from the control signal interface portion, and
wherein the memory chip comprises:
first and second channel regions suitable for operating independently from each other; and
a channel selection portion suitable for coupling the test setting portion to one either of the first channel region or the second channel region in response to a channel selection signal, and
wherein the first and second channel regions include first and second control signal reception portions suitable for setting information related to operation of the corresponding one of the first and second channel regions based on the command signal and the address signal, respectively.

14. The semiconductor apparatus of claim 13, wherein the control signal interface portion is configured to transmit the command signal and the address signal to the first and second control signal reception portions through a first set of through-vias.

15. The semiconductor apparatus of claim 13, wherein the test setting portion is configured to provide the command signal and the address signal to the channel selection portion through a second set of through-vias.

16. The semiconductor apparatus of claim 13, wherein the first control signal reception portion comprises:
an input path selection unit suitable for receiving the command signal and the address signal from one among a stack chip test portion, the control signal interface portion and the channel selection portion in response to an input path selection signal; and
a mode setting unit suitable for setting the information related to operation of the first channel region based on the command signal and the address signal, which are outputted from the input path selection unit.

17. The semiconductor apparatus of claim 16, wherein the first control signal reception portion further comprises:
an output path selection unit suitable for outputting the information set by the mode setting unit, to one among the stack chip test portion, the control signal interface portion and the channel selection portion in response to an output path selection signal.

18. The semiconductor apparatus of claim 13, wherein the second control signal reception portion comprises:
an input path selection unit suitable for receiving the command signal and the address signal from one among a stack chip test portion, the control signal interface portion, and the channel selection portion in response to an input path selection signal; and
a mode setting unit suitable for setting the information related to operation of the second channel region based on the command signal and the address signal, which are outputted from the input path selection unit.

19. The semiconductor apparatus of claim 18, wherein the second control signal reception portion further comprises:
an output path selection unit suitable for outputting the information set by the mode setting unit, to one among the stack chip test portion, the control signal interface portion, and the channel selection portion in response to an output path selection signal.

* * * * *